United States Patent [19]

Lindmayer

[11] 4,028,151

[45] June 7, 1977

[54] METHOD OF IMPREGNATING A SEMICONDUCTOR WITH A DIFFUSANT AND ARTICLE SO FORMED

[75] Inventor: Joseph Lindmayer, Bethesda, Md.

[73] Assignee: Solarex Corporation, Rockville, Md.

[22] Filed: Jan. 19, 1976

[21] Appl. No.: 650,139

[52] U.S. Cl. .............................. 148/189; 148/1.5; 148/33; 148/186; 252/62.3 E
[51] Int. Cl.$^2$ ....................................... H01L 21/223
[58] Field of Search ............ 148/189, 186, 1.5, 33; 252/62.3 E

[56] References Cited

UNITED STATES PATENTS

| | | | |
|---|---|---|---|
| 3,442,725 | 5/1969 | Huffman et al. .................... | 148/189 |
| 3,608,189 | 9/1971 | Gray ............................. | 148/190 X |
| 3,685,140 | 8/1972 | Engeler ......................... | 148/190 X |
| 3,690,968 | 9/1972 | Fa et al. ........................ | 148/187 X |
| 3,925,107 | 12/1975 | Gdula et al. .................... | 148/1.5 |

*Primary Examiner*—G. Ozaki

[57] ABSTRACT

Crystalline silicon wafers have an electrical junction formed at a surface thereof by impregnating the surface with a diffusant, such as phosphorus, in an atmosphere that includes significant quantities of helium.

10 Claims, No Drawings

METHOD OF IMPREGNATING A SEMICONDUCTOR WITH A DIFFUSANT AND ARTICLE SO FORMED

This invention relates to a method of forming an electrical junction at the surface of a semiconductor device, such as a wafer of crystalline silicon. More particularly, it refers to such a method in which a diffusant, e.g., phosphorus or boron, is diffused into the body of the wafer to form a junction at that surface, the junction being of a polarity opposite that of the wafer, itself.

Semiconductor devices may be formed from wafers of crystalline silicon in which the silicon, often in the form of a wafer, has been doped with a certain type of impurity causing the silicon wafer to adopt a specific polarity. According to the impurity introduced, the silicon becomes either a p-type or an n-type material. If a dopant such as boron is used, the silicon wafer will be p-type. To obtain n-type crystalline material, a dopant such as phosphorus is utilized.

In the process of making a semiconductor device, a usual, initial step is to form a junction at the surface of the semiconductor material. This junction usually contains the type of dopant opposite to that used in making the original wafer. So, if a junction is formed on a p-type silicon wafer containing boron impurities distributed throughout the wafer, the junction will be made by utilizing a process in which the other type of dopant is diffused into a surface of the wafer. Such a dopant could be phosphorus or arsenic, for example.

The introduction of a diffusant into the wafer can be accomplished in a variety of ways such as utilizing a gaseous compound of phosphorus, e.g., phosphine. When phosphine gas is mixed into some inert, gaseous carrier such as argon or nitrogen and a quantity of oxygen is added to the gas mixture, and this mixture is utilized as the atmosphere in a furnace in which a silicon wafer doped with boron is heated to an elevated temperature, the phosphorus from the phosphine diffuses into the silicon to the requisite degree. The resulting wafer has a junction formed at its surface of a polarity opposite to that of the doped wafer, itself. There are other ways to introduce opposite type dopant, such as by coating the wafer surface with a compound containing the dopant and then inserting the wafer in a furnace and heating it in the presence of an inert, gaseous atmosphere. Here, too, the gas is usually nitrogen or argon and the atmosphere may or may not contain oxygen.

It is the primary object of the present invention to provide an improved process of forming junctions on silicon semiconductor materials, in which the junctions so formed have electrical properties superior to those which are formed using conventional processes. Of course, the silicon wafer so produced is an equally important object of the invention.

It is another object of this invention to improve the electrical characteristics of semiconductor devices by utilizing a simple diffusion process to form an improved junction. This diffusion process should be inexpensive and should not require any complicated equipment.

With deceptive simplicity, I have discovered that helium or neon, preferably the former, can be used greater than 10% by volume or in substantial volume in the atmosphere utilized during diffusion to form the p-n junction. The theoretical reasons why improved electrical characteristics of the diffused junction are achieved is not precisely known. Both nitrogen and argon have previously been utilized as the prime components of the inert gas atmosphere but the use of helium probably results in less damage to the crystalline structure of the silicon material, itself. It appears that the diffusion process is altered beneficially. Specific changes appear to be the formation of less phosphor glass, modification of the diffusion profile, and improved electrical characteristics. In a solar energy cell, these improved characteristics result in higher conversion efficiency.

As a specific example of the practice of my invention, boron-doped silicon wafers were selected for impregnation with phosphorous as a diffusant to form silicon wafers having an n-p junction, which wafers would be the precursors of silicon solar energy cells. Wafers of substantially monocrystalline silicon were selected, the circular wafers being two and one-quarter inches in diameter and having a thickness of about 13 mils. Wafers were placed on a tray and inserted into a diffusion furnace preheated to 850° C. During the period of time that the wafers were heated to 850° C in the furnace, helium was introduced into the furnace to maintain an inert atmosphere therein. Two other gases were then simultaneously introduced into one end of the furnace while the flow of helium was maintained. Phosphine diluted with 99% argon entered at a rate of 500 cc/minute; oxygen at 50 cc/minute and helium at 1000 cc/minute. The spent gaseous mixture remaining was exhausted at the other end of the furnace. The silicon wafers were maintained in this atmosphere for 15 minutes, after which the flow of phosphine and oxygen was stopped and the wafers extracted in helium. The same process was repeated using argon in place of the helium, then repeated again using nitrogen in lieu of helium.

After treatment substantially as described above, in which the only variable was the helium, argon or nitrogen atmosphere in which diffusion took place, the three groups of wafers so produced were tested for production of electricity under known tests with the space sun created by an xenon lamp. As so tested, the wafers (with electrical contacts) produced in the argon atmosphere generated approximately 66 milliwatts per 4 square centimeters power. The nitrogen atmosphere wafers generated 64 milliwatts. The wafers into which phosphorus was diffused in the helium atmosphere generated 74 milliwatts per 4 square centimeters. This improvement in excess of 10% is deemed highly significant, particularly in view of the ease with which the improvement was obtained and the fact that no special equipment was required, e.g., a different furnace.

The specific example described hereinbefore in which helium was introduced into the furnace together with oxygen and phosphine diluted with argon as a carrier was repeated. The only change made was that helium was used in place of argon as the diluent for the phosphine. Wafers produced by the practice of this method generated up to approximately 77 milliwatts per 4 square centimeters power. Consequently, it is indicated that the maintenance of an inert atmosphere in which helium rather than argon or nitrogen is used exclusively results in the production of still more efficient semiconductor devices and solar energy cells.

I consider that my invention resides in the use of helium or, secondarily, neon, in the inert gas atmosphere to which the silicon semiconductor material is subjected during diffusion. The precise temperature and time of furnace diffusion may vary according to such factors as the diffusant utilized and will quickly become optimized by those skilled in this art. For diffusion employing gaseous phosphine and substantially monocrystalline silicon wafers, I have found that temperatures from about 750° to 900° C for about 5 to 20 minutes results in good impregnation of a wafer surface with elemental phosphorus, assisted by the presence of a minor amount of oxygen.

Alterations and modifications of the methods herein described will be apparent to those skilled in the semiconductor art. As to all such equivalent methods and the products produced thereby, it is desired that they be included with the purview of my invention, which is to be limited only by the scope of the following, appended claims.

I claim:

1. A method of forming a junction at a surface of a silicon wafer, comprising heating said surface with a diffusant in the presence of an inert gas selected from the group consisting of helium and neon in an amount sufficient to enhance the electrical performance of the junction resulting from penetration of said wafer surface by said diffusant compared to a junction formed by diffusion in an atmosphere of argon or nitrogen.

2. A silicon wafer having a surface impregnated with diffusant by performance of the method of claim 1.

3. A method of forming a junction at the surface of a silicon wafer as claimed in claim 1, in which the inert gas is helium.

4. A method of forming a junction at the surface of a silicon wafer as claimed in claim 1, in which the diffusant is phosphorus.

5. A method of forming a junction at the surface of a silicon wafer as claimed in claim 1, in which the inert gas is helium and the diffusant is phosphorus.

6. A method of forming a junction at a surface of a silicon wafer, comprising positioning the wafer in a furnace, introducing into the furnace a diffusant in gaseous form, maintaining in said furnace an atmosphere including in addition to said diffusant helium gas in an amount sufficient to enhance the electrical performance of the junction subsequently formed in comparison to a junction formed by diffusion in a similar atmosphere of argon or nitrogen, and heating the contents of the furnace for a period of time sufficient to effect penetration of the wafer surface by the diffusant.

7. A method of forming a junction at a surface of a silicon wafer as claimed in claim 6, in which said diffusant is phosphorus and the gaseous form thereof is phosphine.

8. A method of forming a junction at a surface of a silicon wafer as claimed in claim 6, in which said atmosphere also contains oxygen.

9. A method of forming a junction at a surface of a silicon wafer as claimed in claim 6, in which there is a continuous introduction into the furnace of phosphine in a dilutant, oxygen and helium.

10. A method of forming a junction at a surface of a silicon wafer as claimed in claim 9, in which the atmosphere in the oven is composed of greater than 10% helium by volume.

* * * * *